United States Patent [19]

Lyden

[11] Patent Number: 4,811,081
[45] Date of Patent: Mar. 7, 1989

[54] SEMICONDUCTOR DIE BONDING WITH CONDUCTIVE ADHESIVE

[75] Inventor: Thomas B. Lyden, Schaumburg, Ill.

[73] Assignee: Motorola, Inc., Schaumburg, Ill.

[21] Appl. No.: 29,294

[22] Filed: Mar. 23, 1987

[51] Int. Cl.[4] .................... H01L 23/12; H01L 23/10; H01L 23/14

[52] U.S. Cl. .......................................... 357/80; 357/74

[58] Field of Search ........................ 357/80, 72, 73, 74; 174/52 FP

[56] References Cited

U.S. PATENT DOCUMENTS

| | | | |
|---|---|---|---|
| 3,818,279 | 6/1974 | Seeger, Jr. et al. | 357/72 |
| 4,147,889 | 4/1979 | Andrews et al. | 357/80 |
| 4,577,214 | 3/1986 | Schaper | 357/80 |
| 4,631,820 | 12/1986 | Harada et al. | 174/52 FP |

Primary Examiner—Andrew J. James
Assistant Examiner—Sheila V. Clark
Attorney, Agent, or Firm—John H. Moore

[57] ABSTRACT

An improved semiconductor assembly includes a semiconductor die that is mounted on a carrier, such as a tape or a substrate, by means of an anisotropically electrically conductive adhesive. The adhesive forms an electrically conductive path between electrical conductors on the carrier and other conductors on the die so that the die can be probe tested before the adhesive is cured and before the die is permanently bonded to the carrier.

12 Claims, 3 Drawing Sheets

SEMICONDUCTOR DIE BONDING WITH CONDUCTIVE ADHESIVE

FIELD OF THE INVENTION

This invention pertains generally to the mounting of semiconductor dies on substrates and on other forms of die carriers. It is particularly applicable to semiconductor dies that are used in TAB (Tape Automated Bonding) processes.

BACKGROUND OF THE INVENTION

In a conventional TAB process, a tape made of Kapton, for example, acts as a carrier for semiconductor dies that are mounted thereon. Each die occupies a predetermined "site" on the tape, and each site typically includes conductive metal patterns which connect electrical contacts on the die to conductive test pads formed on the tape. With this arrangement, test equipment probes can be connected to the test pads on the tape in order to test the die before it is removed from the tape and permanently mounted on a substrate, a printed circuit board, or the like.

If the tape-mounted die proves to be defective during the above-mentioned test, the part of the tape defining the site for the defective die cannot be reused. Thus, a defective die results not only in the loss of a die, but also the loss of a relatively expensive die site.

Another drawback to conventional TAB techniques arises from the fact that a die which passes its tests, and then becomes permanently mounted on a substrate, is not protected from the environment. An additional step, such as potting, is required to seal the die from environmental contamination.

OBJECTS OF THE INVENTION

It is a general object of the invention to provide an improved semiconductor assembly and bonding technique for semiconductor dies which overcome the deficiencies mentioned above.

It is a more specific object of the invention to provide an improved arrangement for holding semiconductor dies on a TAB tape and for subsequently mounting the dies onto a different die carrier such as a substrate.

DESCRIPTION OF THE PREFERRED EMBODIMENT

Figure 1:
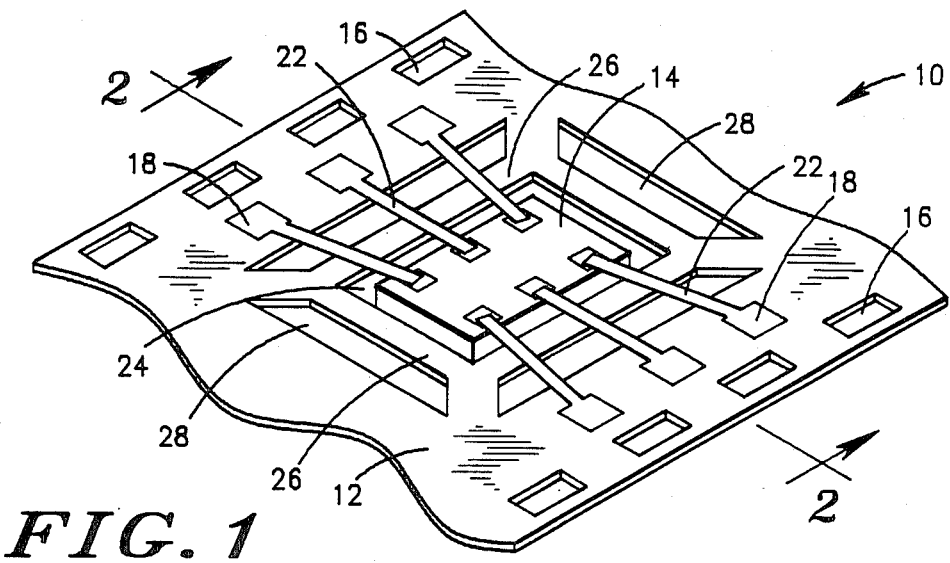
FIG. 1 shows a conventional TAB arrangement wherein a semiconductor die is carried by a tape.
Figure 2:
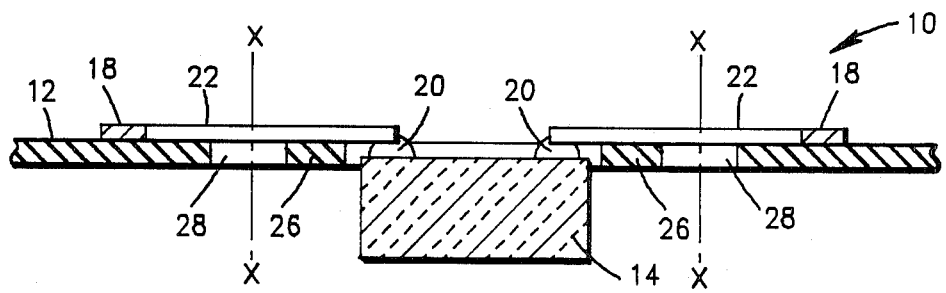
FIG. 2 is a view taken along lines 2—2 in FIG. 1.

Before describing the present invention, a conventional TAB structure will be discussed in order to more clearly illustrate the differences between the two and the advantages of the invention. Referring first to FIGS. 1 and 2, a conventional TAB structure 10 is shown wherein a carrier tape 12 (made of Kapton, for example) is used to hold a semiconductor die 14. This arrangement is normally used to test and otherwise handle the die 14 (and other dies that are similarly held on the non-illustrated portion of the tape 12) prior to the die being permanently mounted on a substrate.

As shown, sprocket holes 16 are formed along the edges of the tape 12 to permit engagement with a rotatable sprocket (not shown) which can advance the tape and dies from one work station to another. Conductive test pads 18 are formed on the surface of the tape 12 and are electrically connected to conductive "bumps" 20 on the die by means of conductive leads 22. The "bumps" 20 are gold-plated metal bonding pads, each of which overlies an aluminum pad (not shown) on the die 14. Thus, each of the test pads 18 on the tape is electrically connected to a corresponding pad on the die. This allows the die to be tested, prior to its separation from the tape, by exercising the functions of the die via test probes (not shown) which can be brought into contact with the test pads 18.

Note that the die 14 is situated in a hole 24 in the tape, and that the hole is surrounded by a support ring 26 formed between the hole 24 and four cutouts 28 in the tape. The purpose of the ring 26 is to provide support for the leads 22. The illustrated portion of the tape 12, along with the test pads 18 and leads 22, essentially comprise a single "site."

When the die 14 is ready to be removed from the tape 12 and permanently mounted on another carrier such as a substrate, the die is cut away from the tape, as along lines X—X in FIG. 2. The die and the attached portions of leads 22 are then mounted on a substrate 30 (FIG. 3) whose upper surface carries electrical conductors 32. In mounting the die on the substrate 30, the leads 22 are bent as shown to contact the desired conductors 32. Typically, each such lead will be soldered to its adjoining conductor at the point of mutual contact.

An advantage of the conventional TAB structure described above is that each die can be tested while still carried by its tape. This reduces the risk of mating a defective die with a substrate (and with other circuitry carried by the substrate).

Figure 3:
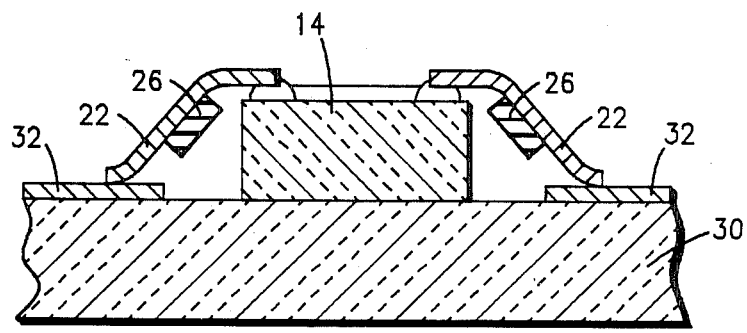
FIG. 3 illustrates how the die of FIG. 1 is mounted on a substrate carrier after having been removed from its tape carrier.

There are also several disadvantages to the conventional arrangement. As mentioned previously, a defective die results in the loss of the relatively expensive die site (as shown in FIG. 1). Another problem with the conventional arrangement is that a good die, having been mounted on a substrate as shown in FIG. 3, is not covered and is not, therefore, protected from the environment unless one or more additional steps are taken to cover the die with a sealant. The uncovered condition of the die results from the fact that, as shown in FIG. 1, the die is situated in an aperture 24 formed in the tap 12. That aperture is needed to permit a heated tool to be brought into contact with the leads 18 in the process of forming the so-called "inner lead bond" by which each lead 22 is joined to its corresponding "bump" 20.

Figure 4:
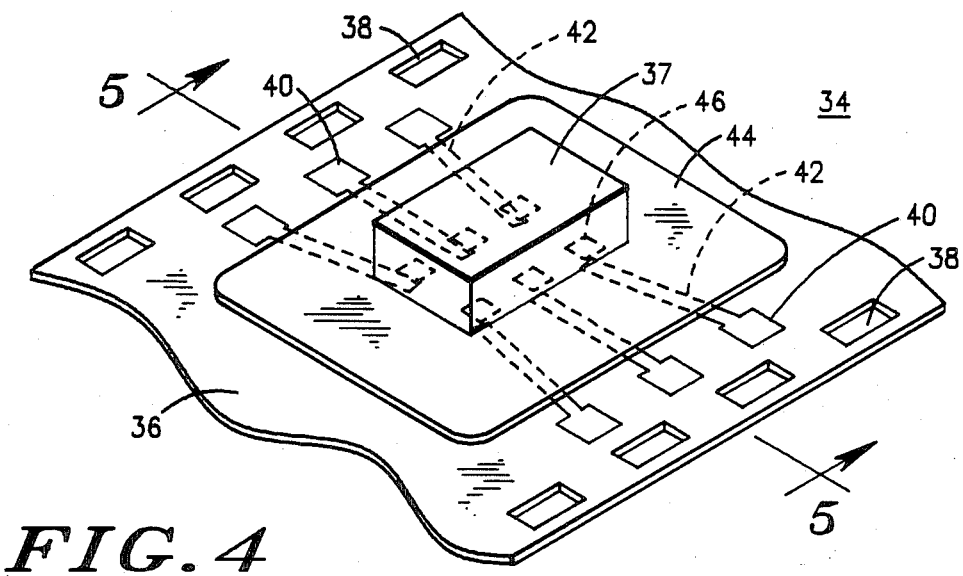
FIG. 4 is a perspective view of a die mounted on a tape carrier in accordance with one aspect of the invention.
Figure 5:
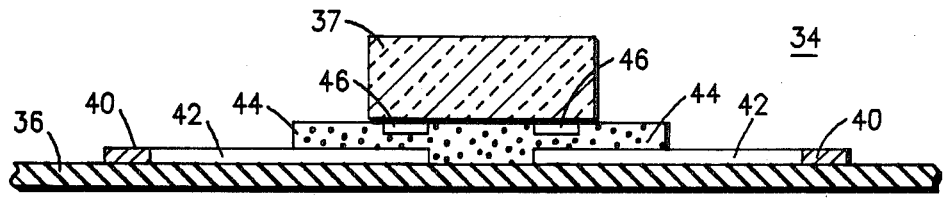
FIG. 5 is a view taken along lines 5—5 in FIG. 4.

Turning now to FIGS. 4 and 5, an improved TAB structure 34 is shown wherein the illustrated die "site" is reusable. The structure 34 includes a carrier tape 36 which may be made of Mylar or the like for carrying a semiconductor die 37. Conventional sprocket holes 38 are formed, as shown, along both edges of the tape.

On the surface of the tape 36, metal (e.g., copper) test pads 40 and conductive leads 42 are formed by conventional techniques such as sputtering or laminating a metal foil and then photo-etching. Alternately, the leads 42 and the test pads 40 may be formed from a thick film conductive polymer.

Situated between the conductive leads 42 and the semiconductor die 37 is an adhesive/conductive element 44 which consists of an anisotropically electrically conductive adhesive. Such an adhesive preferably includes internal conductive particles that are dispersed so as to provide electrical conductivity only in the vertical axis. In the lateral and longitudinal axes of the adhesive, minimal conductivity is exhibited. One example of such an adhesive/conductive element is known commercially as Z-AXIS Interconnect Film. This film is available from the Sheldahl Company, Northfield, Minn., and has been heretofore primarily used as a termination for flexible cables As shown, the element 44 is contoured and situated to cover at least a portion of each lead 42 and all of the tape area below the die 37. Alternately, the element 44 may be enlarged to cover even the test pads 40, although it is preferred that the test pads remain uncovered to permit direct contact with test probes.

As best shown in FIG. 5, the die 37 has electrical contacts 46 which may be of the type known as "capped pads." Essentially, these are conventional aluminum bonding pads covered with thin films of titanium tungsten and gold. Other types of electrical contacts, even the previously-described "bumps", may be used instead of the capped pads.

Referring again to the adhesive/conductive element 44, various forms of it may be used. For example, when used in a liquid form, it can be rolled or printed onto the tape 36. When it is obtained in the form of a roll of tape, an appropriately-sized piece of it may be cut out and pressed into place on the tape 36. Its adhesiveness will hold it in place on the tape and will also hold the die 37 when the die is pressed into place on the element 44. In the event that a transparent adhesive/conductive element 44 is used with a transparent tape 36, the die 37 is more easily aligned such that each of its electrical contacts 46 is in registration with its mating lead 42.

Preferably, the adhesive/conductive element 44 will be laid down as a so-called "B-stage epoxy" or similar material which remains tacky until it has been fully cured by means of heat, ultraviolet radiation, or other means. Thus, the structure shown in FIGS. 4 and 5 is not permanent (when uncured), because the die 37 can still be removed and replaced by a different die, as described below.

Referring again to FIG. 5, the illustrated structure is now in condition for the die 37 to be tested, as by the use of test probes applied to the test pads 40. An electrical connection is provided between each test pad 40 and the die 37 via a path which includes a lead 42, the portion of the adhesive/conductive element 44 that lies sandwiched between the inner end of the lead 42 and its overlying electrical contact 46, and the contact 46 itself.

Figure 6:
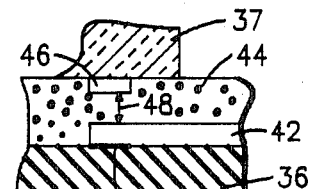
FIG. 6 is an expanded view of some of the elements between the die 37 and the tape 36 of FIG. 5.

As shown more clearly in FIG. 6, the anisotropic conductivity of the adhesive/conductive element 44 permits current to flow only in the direction illustrated by the arrow 48 to complete an electrical path between the illustrated lead 42 and the overlying electrical contact 46. Conduction in other directions does not occur to any substantial degree.

In the event that probe testing proves the die 37 to be defective, the die 37 may be lifted off the element 44 and replaced by a different die. Thus, the die site on the tape 36 is reusable, thus providing a less expensive TAB process.

Assuming that the die 37 proves to be functional, the tape site structure, comprising the die 37, the adhesive element 44, the leads 32 and the underlying portion of the tape 36, will eventually be permanently mounted on a different carrier which may be a ceramic substrate, a printed circuit board, or another device intended to be a permanent or semi-permanent support for the die. That process will now be described.

Before the tape site structure is removed from the main body of the tape carrier 36, that portion of the adhesive element 44 which underlies the die 37 may be cured, leaving the reminder of the element 44 in its uncured state. This may be accomplished by directing ultraviolet radiation or localized heat only to the portion of element 44 that is directly beneath the die 37. This selective curing will firmly bond the die 37 and the tape 36 to the adhesive element 44.

Figure 7:
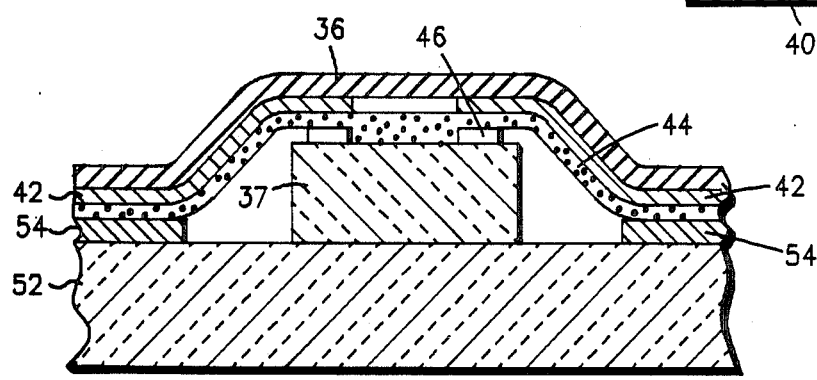
FIG. 7 illustrates how the die of FIG. 4 is preferably mounted on a substrate carrier after having been removed from its tape carrier.

Next, the die may be removed from the main body of the tape carrier by cutting through the tape along the perimeter of the adhesive element 44. The die 37, carrying with it the attached adhesive element 44, the leads 42, and the portion of the tape 36 underlying the adhesive element 44, is flipped over and mounted on a different carrier such as the substrate 52 as shown in FIG. 7. By applying downward pressure on the top surface of the tape 36 on either side of the die 37, the structure will be formed as shown so that the uncured portions of the adhesive element 44 are caused to adhere to electrical conductors 54 that are carried on the upper surface of the substrate 52. The conductors 54 may be conventional photo-etched conductive patterns whose opposite ends (not shown) connect to other circuit elements on the substrate 52.

When the die 37 is properly mounted on the substrate 52, each conductor 54 is vertically aligned with a corresponding lead 42, thereby establishing a path of electrical conductivity from each conductor 54 to a corresponding electrical contact 46 on the die 37. For the conductor 54 and the contact 46 which are situated on the right-hand side of FIG. 7, the conductivity path is as follows. From the conductor 54, the path of electrical conductivity extends vertically upward through the adhesive element 44 (which conducts only in the vertical direction) to the adjacent lead 42. Thence, the path follows the lead 42 upwardly and to the left up to the illustrated termination of the lead 42. The path continues downwardly, again through the adhesive element 44, to the electrical contact 46. Similar conductivity paths exist for all other pairs of conductors 54 and contacts 46 so that the die 37 is properly connected in circuit to whatever elements are connected to the opposite ends of the conductors 54. At this point, the operation of the die 37 and the circuitry connected to it via the conductors 54 may be fully tested. If a fault exists in that circuitry, the die 37 (with the adhesive, leads and tape to which it has been bonded) may be removed from the substrate 52 and placed on a different substrate. Thus, only the defective substrate is lost. The die itself and the tape site structure to which it is bonded are saved for use on a different substrate. This is another advantage over conventional TAB structures which are permanently bonded to their substrates before the substrate circuitry and the attached die are tested together.

If the above-mentioned testing discloses no defects, the die 37 may now be permanently bonded to the substrate by curing the previously-uncured portions of the adhesive element 44. This may be accomplished by heating the entire structure shown in FIG. 7 in an oven to ensure that all adhesive becomes fully cured.

Another important advantage of the structure shown in FIG. 7 is that the die 37 is sealed from the environment both by the tape 36 that remains over the die, and by the cured adhesive that surrounds the die. Compare this to the conventional structure shown in FIG. 3 wherein the die 14 is exposed to the environment. As a result of such sealing, the structure shown in FIG. 7 is particularly well-suited for use in harsh environments, including under-the-hood automotive applications.

Figure 8:
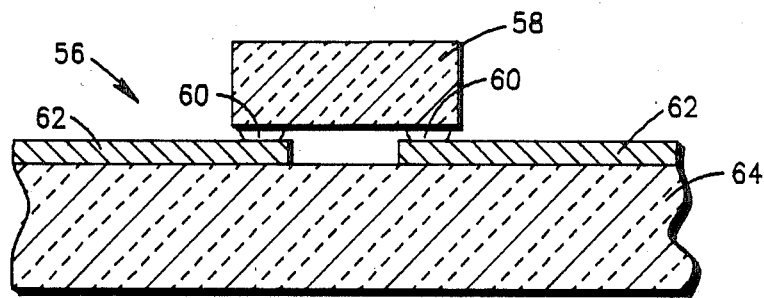
FIG. 8 shows a conventional flip-chip arrangement for mounting a die on a substrate.

The invention may be applied to semiconductor structures which differ from those discussed above. For example, conventional flip-chip structures may be modified so as to use the same type of adhesive/conductive element as previously described. In FIG. 8, a conventional flip-chip structure 56 is shown wherein a semiconductor die 58 carries solder bumps 60 for making electrical contact between the die and conductors 62 on a carrier substrate 64.

Figure 9:
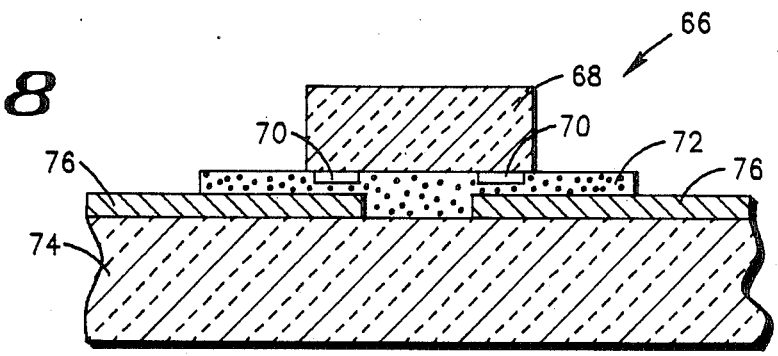
FIG. 9 shows a flip-chip arrangement whereby a die is mounted on a substrate in accordance with the invention.

A flip-chip structure 66 that is modified per the present invention is shown in FIG. 9. In this embodiment, a die 68 carries electrical contacts in the form of capped pads 70. An anisotropically electrically conductive adhesive 72 is situated as shown to bond the die 68 to a carrier substrate 74 and to electrical conductors 76 carried on the upper surface of the substrate. As discussed previously, the element 72 conducts substantially only in the vertical direction so as to provide a conductive path from each electrical contact 70 to its underlying conductor 76.

Figure 10:
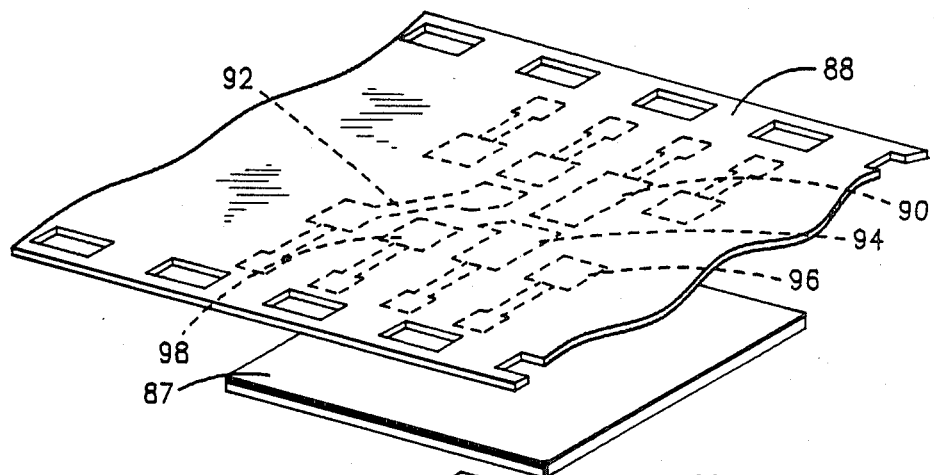
FIG. 10 shows a conductive lead pattern for use with a semiconductor die structure according to another aspect of the invention.

In some applications, the resistivity of the adhesive/conductive layer may need to be reduced. Referring to FIG. 6, for example, the surface area of the contact 46 which faces the element 44 may be in the order of about 4 square mils. For that area, the resistivity of the element 44 may be about 10 ohms, as measured between the contact 46 and the conductor 42. For certain applications, such as ground connections or power input leads, 10 ohms may be more resistance than is desirable. The method presented herein for lowering such resistance will now be described with reference to FIG. 10.

The illustrated semiconductor die 78 has an upper surface on which conductive patterns 80, 82, 84, 85 and 86 have been formed for input/output pads. Clearly, the surface areas of the illustrated patterns 80, 82, and 84 are relatively enlarged in comparison to the surface areas of the conventionally sized pads 85 and 86. The die 78 will be covered by an adhesive/conductive layer 87 of the type described previously. A tape carrier 88 is situated immediately above the layer 87 and carries a pattern of relatively enlarged conductive pads 90, 92, 94 whose geometry corresponds with the geometry of patterns 80, 82 and 84 on the die 78. A pattern of smaller, conventional pads such as 96 and 98 on the tape 88 also corresponds to the geometry of the smaller pads such as 85 and 86 on the die 78. This arrangement provides enlarged surface areas, as needed, for the conductive patterns of selected input/output pads. By increasing the area of the patterns 80 and 90, for example, the resistivity of the layer 86 between them has also been reduced. No such enlargement is required for the patterns whose input/output pads can tolerate a higher resistance through the layer 86.

The above-described use of enlarged conductors is applicable to the structures shown in FIGS. 4, 7 and 9. For example, a pattern of enlarged conductors could be used on the die 37 and the tape 36 of FIGS. 4 and 7. Likewise, a pattern of enlarged conductors could be used on the die 68 and the substrate 74 of FIG. 9.

Although the invention has been described in terms of preferred structures, it will be obvious to those skilled in the art that various modifications may be made to the illustrated structures without departing from the invention. For example, although the invention has been described in the environment of TAB processes using tape carriers, it is not necessary that tape be used. The tape may be replaced by molded die carriers that carry conductive lead patterns and pads on their inner surfaces The molded carriers could be progressively molded to attach each to an adjacent carrier in a strip of carriers, with a thin web between carriers to permit continuous reel-to-reel processing. Many other variations to the illustrated embodiments will also be apparent Accordingly, it is intended that all such alterations and variations be considered as within the spirit and scope of the invention as defined by the appended claims.

What is claimed is:

1. A semiconductor assembly, comprising:
   a semiconductor die having at least one electrical contact thereon;
   a carrier for the die;
   at least one electrical conductor formed on the carrier; and
   an anisotropically electrically conductive adhesive situated between said electrical conductor and the electrical contact on the die.

2. A semiconductor assembly as set forth in claim 1 wherein said carrier comprises a tape.

3. A semiconductor assembly as set forth in claim 1 wherein the electrical contact on the die includes a relatively enlarged conductive pattern, wherein the electrical conductor on the carrier includes a correspondingly enlarged conductive pattern, and wherein said conductive patterns are in substantial vertical alignment with each other, whereby the resistance of the conductive adhesive between said conductive patterns is relatively reduced.

4. A semiconductor assembly as set forth in claim 1 wherein said carrier is a substrate.

5. A semiconductor assembly for use with a tape automated bonding process, comprising:
   a tape for carrying at least one semiconductor die;
   a plurality of test pads formed on the tape;
   a plurality of conductive leads on the tape, each lead having a first end that is coupled to a test pad and a second end;
   a layer of anisotropically electrically conductive adhesive covering at least the second ends of conductive leads; and
   a semiconductor die that has a plurality of electrical contacts thereon, the die being situated on the adhesive so that the electrical contacts on the die are substantially vertically aligned with the second ends of the conductive leads.

6. A semiconductor assembly as set forth in claim 5 wherein selected electrical contacts on the die include relatively enlarged conductive patterns, wherein selected conductive leads include correspondingly enlarged conductive patterns, and wherein said conductive patterns are in substantial vertical alignment with each other, whereby the resistance of the conductive adhesive between the enlarged patterns is relatively reduced.

7. A semiconductor assembly formed in connection with a tape automated bonding procedure which uses a tape to carry semiconductor dies, the semiconductor assembly comprising:
   a substrate;
   a semiconductor die mounted on the substrate;
   at least one electrical contact formed on the die;
   an electrical conductor on the substrate;
   an anisotropically electrically conductive adhesive covering at least portions of the electrical contact on the die and the electrical conductor on the substrate;
   a conductive lead above the adhesive and extending from a point above the electrical contact to a point above the electrical conductor on the substrate; and
   a portion of the tape covering the adhesive so as to help seal the die from the environment.

8. A semiconductor assembly as set forth in claim 7 wherein the electrical conductor on the substrate includes a relatively enlarged conductive pattern, wherein the conductive lead includes a correspondingly enlarged conductive pattern, and wherein said conductive patterns are in substantial vertical alignment with each other.

9. A flip-chip semiconductor assembly, comprising:
   a substrate;
   at least one conductive pattern on the substrate;
   an anisotropically electrically conductive adhesive covering at least a part of the substrate and the conductive pattern; and
   a semiconductor die having at least one electrical contact, the die being positioned on the adhesive such that the electrical contact faces, and is in substantially vertical alignment with, the conductive pattern.

10. A semiconductor assembly, comprising:
    a semiconductor die;
    a plurality of conductive patterns formed on the die, with selected patterns being relatively enlarged in comparison to other patterns on the die;
    an anisotropically electrically conductive adhesive covering the conductive patterns on the die; and
    a carrier having a plurality of conductive patterns formed thereon to match the patterns on the die.

11. A semiconductor assembly as set forth in claim 10 wherein said carrier comprises a substrate.

12. A semiconductor assembly as set forth in claim 10 wherein said carrier comprises a tape.

* * * * *